United States Patent
Kikuchi et al.

(10) Patent No.: US 9,482,834 B2
(45) Date of Patent: Nov. 1, 2016

(54) SEMICONDUCTOR OPTICAL DEVICE AND METHOD FOR PRODUCING SEMICONDUCTOR OPTICAL DEVICE

(71) Applicant: SUMITOMO ELECTRIC INDUSTRIES, LTD., Osaka-shi, Osaka (JP)

(72) Inventors: Takehiko Kikuchi, Yokohama (JP); Hideki Yagi, Machida (JP); Yoshihiro Yoneda, Isehara (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/627,885

(22) Filed: Feb. 20, 2015

(65) Prior Publication Data

US 2015/0241648 A1   Aug. 27, 2015

(30) Foreign Application Priority Data

Feb. 27, 2014   (JP) ................................. 2014-036850

(51) Int. Cl.
*G02B 6/30* (2006.01)
*G02B 6/12* (2006.01)
(Continued)

(52) U.S. Cl.
CPC ..... *G02B 6/4295* (2013.01); *H01L 31/035281* (2013.01); *H01L 31/105* (2013.01); *H01L 31/184* (2013.01); *H01L 2924/30105* (2013.01)

(58) Field of Classification Search
CPC ... G02B 6/4295; H01L 31/18; H01L 31/112; H01L 31/1126; H01L 31/1129; H01L 31/035281; H01L 2924/30105
USPC .............. 385/14, 38, 49, 131; 257/431, 432, 257/E33.076; 438/57, 65
See application file for complete search history.

(56) References Cited

U.S. PATENT DOCUMENTS

2002/0094598 A1*  7/2002  Kobayashi ............. G02B 6/125
                                                      438/57
2005/0259708 A1* 11/2005  Park ........................ H01S 5/026
                                                      372/50.21
(Continued)

FOREIGN PATENT DOCUMENTS

JP    63-31187   *  2/1988   ............... H01S 3/18
JP    2-194688   *  8/1990   ............... H01S 3/18
(Continued)

OTHER PUBLICATIONS

"Ultrawide-band/high-frequency photodetectors" by Kato, IEEE Transaction on Microwave Theory and Techniques, vol. 47, No. 7, pp. 1265-1281, 1999.*
(Continued)

*Primary Examiner* — Robert Tavlykaev
(74) *Attorney, Agent, or Firm* — Smith, Gambrell & Russell, LLP.

(57) ABSTRACT

A semiconductor optical device includes a substrate including first and second regions arranged in a first direction, a photodiode disposed on the first region, an optical waveguide disposed on the second region, and a buried layer disposed on a side surface of the photodiode. The side surface of the photodiode extends in the first direction. The photodiode has a first end surface intersecting with the first direction, and the optical waveguide is in direct contact with the first end surface. The buried layer is composed of a III-V compound semiconductor doped with a transition metal. The photodiode includes a stacked semiconductor layer including a first cladding layer, a light-absorbing layer and a second cladding layer stacked in that order on the substrate. The light-absorbing layer has a side surface having at least a portion recessed with respect to a side surface of the first cladding layer.

10 Claims, 13 Drawing Sheets

(51) Int. Cl.
*G02B 6/44* (2006.01)
*H01L 31/0232* (2014.01)
*H01L 21/00* (2006.01)
*G02B 6/42* (2006.01)
*H01L 31/0352* (2006.01)
*H01L 31/105* (2006.01)
*H01L 31/18* (2006.01)

(56) References Cited

U.S. PATENT DOCUMENTS

2006/0273421 A1* 12/2006 Yasuoka ............ H01L 31/0232
  257/438
2008/0237452 A1* 10/2008 Yoneda ................ H01L 25/167
  250/214 R
2009/0010291 A1* 1/2009 Takahashi .............. B82Y 20/00
  372/45.011
2013/0062718 A1* 3/2013 Tada ..................... H01L 31/105
  257/432

FOREIGN PATENT DOCUMENTS

| JP | 6-37388 | * | 2/1994 | ............... H01S 3/18 |
| JP | 7-111361 | * | 4/1995 | ............... H01S 3/18 |
| JP | 2013-110207 | | 6/2013 | |

OTHER PUBLICATIONS

"High-speed waveguide photodetectors" by Kato et al, Proceedings of the 7th Conference of Indium Phosphide and Related Materials, pp. 349-352, May 1995.*
"100-GHz, 50%-efficiency mushroom-mesa waveguide p-i-n photodiode for a 1.55 um wavelength" by Kato et al, IEEE Photonics Technology Letters, vol. 6, No. 6, pp. 719-721, Jun. 1994.*

* cited by examiner

SEMICONDUCTOR OPTICAL DEVICE AND METHOD FOR PRODUCING SEMICONDUCTOR OPTICAL DEVICE

BACKGROUND OF THE INVENTION

1. Field of the Invention

The present invention relates to a semiconductor optical device and a method for producing a semiconductor optical device.

2. Description of the Related Art

Japanese Unexamined Patent Application Publication No. 2013-110207 discloses a waveguide-type photodiode in which an optical waveguide is coupled with a front end surface of the photodiode through a butt-joint. The optical waveguide has an upper cladding layer and a core layer doped with Fe in order to decrease the dark current of the photodiode. The concentration of Fe in the core layer is set lower than the saturated concentration in a (100) orientation in order to avoid increasing the propagation loss of the optical waveguide. Furthermore, the Fe concentration of the upper cladding layer is set higher than the saturated concentration in a (100) orientation in order to decrease the dark current of the photodiode.

SUMMARY OF THE INVENTION

In the waveguide-type photodiode disclosed in Japanese Unexamined Patent Application Publication No. 2013-110207, the Fe doped layers are butt-jointed to the front end surface. The dark current originated from the front end surface is decreased by the high content of Fe in the upper cladding layer. The dark current originated from other surfaces such as side surfaces and a rear end surface are not suppressed by the butt-joint at the front end surface.

In optical communications, a coherent optical demodulator receives modulated optical signals. It converts the phase difference of optical signals into the intensity difference of light. Photodiodes integrated in the coherent optical demodulator are used to convert the intensity difference of light into electrical signals. Photodiodes having low dark current are required for the coherent optical demodulator, because the coherent optical demodulator has to detect a small intensity differences. In addition, photodiodes having excellent high frequency response are also required in order to realize high-speed photoelectric conversion of optical signals. Therefore, photodiodes having low dark current and high frequency response are desired in the field of optical communications.

According to one aspect of the present invention, a semiconductor optical device includes a substrate including a first region and a second region that are arranged in a first direction; a photodiode disposed on the first region of the substrate, the photodiode having a first end surface and a second end surface opposite to the first end surface, the first end surface extending along a reference plane intersecting with the first direction; an optical waveguide disposed on the second region of the substrate, the optical waveguide being in direct contact with the first end surface of the photodiode at a first butt-joint portion; and a buried layer disposed on a side surface of the photodiode that extends in the first direction, the buried layer being composed of a III-V compound semiconductor doped with a transition metal. The photodiode includes a stacked semiconductor layer including a first cladding layer disposed on the substrate, a light-absorbing layer disposed on the first cladding layer, and a second cladding layer disposed on the light-absorbing layer. The light-absorbing layer has and a side surface of the first cladding layer, and the side surface of the light-absorbing layer has a side surface having at least a portion recessed with respect to a side surface of the first cladding layer.

According to another aspect of the present invention, a method for producing a semiconductor optical device includes the steps of preparing a substrate including a first region and a second region; forming an epitaxial wafer including a first semiconductor multilayer disposed on the first region of the substrate, and a second semiconductor multilayer disposed on the second region of the substrate, the first semiconductor multilayer including a first cladding layer, a light-absorbing layer, and a second cladding layer stacked in that order on the substrate; forming a first mask on the epitaxial wafer, the first mask having a first pattern defining a photodiode and a second pattern defining an optical waveguide; forming a mesa structure in the first and second regions by etching the first semiconductor multilayer and the second semiconductor multilayer using the first mask; forming a recessed side surface of the light-absorbing layer in the mesa structure in the first region by selectively etching the light-absorbing layer using a wet etching method; and forming a buried layer composed of a III-V compound semiconductor doped with a transition metal on a side surface of the mesa structure.

DESCRIPTION OF THE PREFERRED EMBODIMENTS

Figure 1:
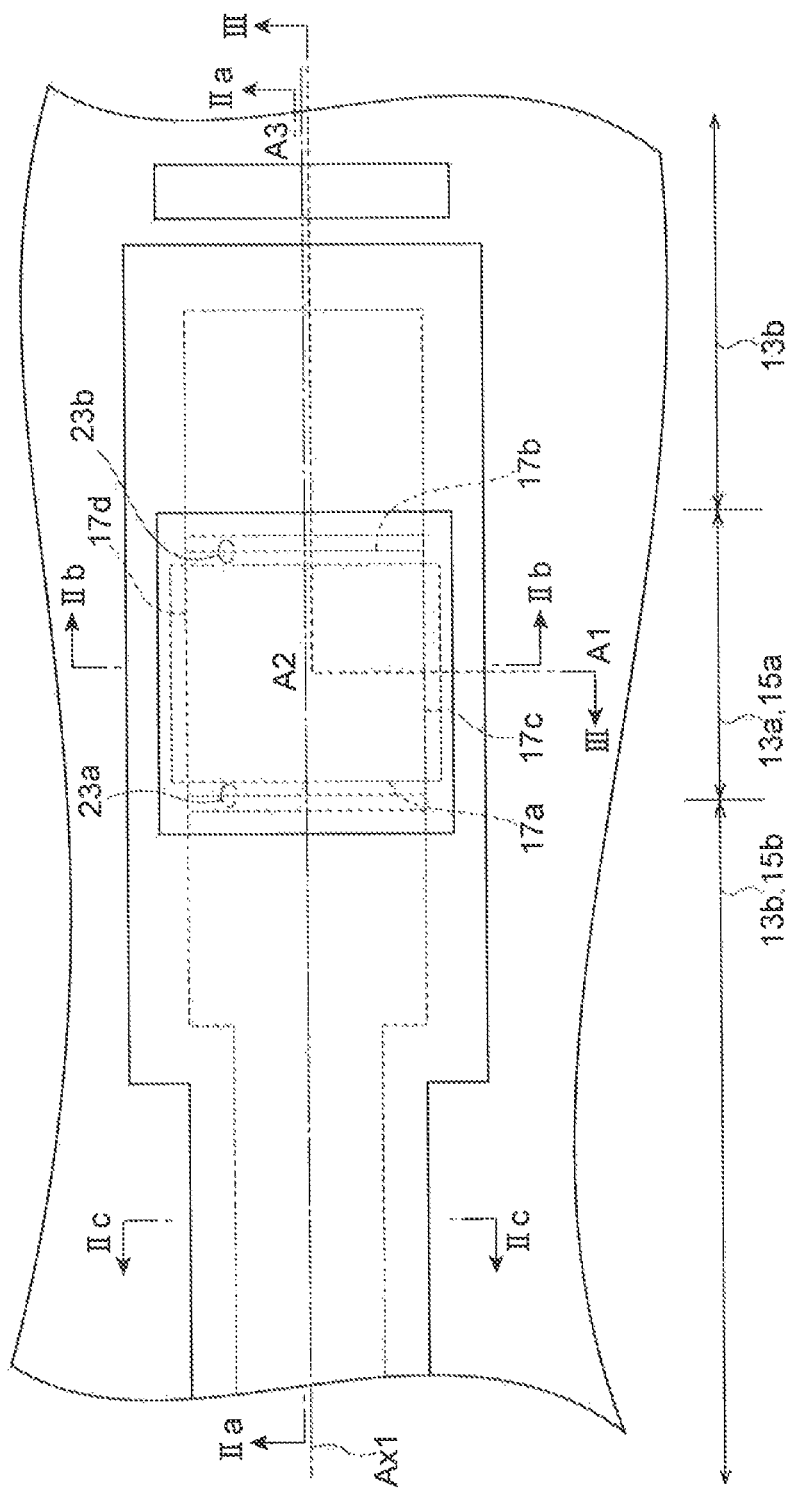
FIG. 1 is a plan view of a semiconductor optical device according to an embodiment.

According to one embodiment, a semiconductor optical device includes (a) a substrate including a first region and a second region that are arranged in a first direction; (b) a photodiode disposed on the first region of the substrate, the photodiode having a first end surface and a second end surface opposite to the first end surface, the first end surface extending along a reference plane intersecting the first direction; (c) an optical waveguide disposed on the second region of the substrate, the optical waveguide being in contact with the first end surface of the photodiode at a first butt-joint portion; and (d) a buried layer disposed on a side surface of the photodiode that extends in the first direction, the buried layer being composed of a III-V compound semiconductor doped with a transition metal. The photodiode includes a stacked semiconductor layer. The stacked semiconductor layer includes a first cladding layer disposed on the substrate, a light-absorbing layer disposed on the first cladding layer, and a second cladding layer disposed on the light-absorbing layer. The light-absorbing layer has a side surface having at least a portion recessed with respect to a side surface of the first cladding layer.

According to this semiconductor optical device, the side surface of the light-absorbing layer has a portion recessed with respect to the side surface of the first cladding layer. Therefore, the distribution of an electric field that extends from the first cladding layer to the second cladding layer through the light-absorbing layer is constricted at the light-absorbing layer having the recessed portion on the side surface. The constriction of the electric field decreases the capacitance of the photodiode. The decreasing of capacitance improves the high frequency response of the photodiode. Furthermore, the side surface of the photodiode is covered with the buried layer composed of a III-V compound semiconductor doped with a transition metal. The covering with the III-V compound semiconductor buried layer decreases the dark current related to the side surface of the photodiode.

In the semiconductor optical device according to one embodiment, the stacked semiconductor layer may include a graded layer whose composition is changed in a thickness direction. The graded layer is disposed between the light-absorbing layer and the second cladding layer. The graded layer has a side surface recessed with respect to a side surface of the second cladding layer. According to this semiconductor optical device, the graded layer assists the formation of the recess on the side surface of the light-absorbing layer during wet-etching process for forming the inverted mesa structure.

In the semiconductor optical device according to one embodiment, the buried layer composed of a III-V compound semiconductor doped with a transition metal may have a thickness of 1.5 µm or less at an upper end of the light-absorbing layer. According to this semiconductor optical device, if the buried layer composed of a III-V compound semiconductor doped with a transition metal is too thick on the side surface of the photodiode, the high-frequency characteristics of the photodiode tends to degrade.

In the semiconductor optical device according to one embodiment, the buried layer composed of a III-V compound semiconductor doped with a transition metal may have a thickness of 0.4 µm or more at an upper end of the light-absorbing layer. According to this semiconductor optical device, if the buried layer is thin on the side surface of the photodiode, the dark current of the photodiode tends to increase.

The semiconductor optical device according to one embodiment may further include an undoped semiconductor layer disposed on the side surface of the photodiode and on the buried layer. According to this semiconductor optical device, the undoped III-V compound semiconductor buried layer on the buried layer composed of a III-V compound semiconductor doped with a transition metal suppresses the interdiffusion of a p-type dopant and contributes to a decrease in the dark current of the photodiode.

In the semiconductor optical device according to one embodiment, the recessed portion of the light-absorbing layer is recessed from the side surface of the first cladding layer in the range of 0.05 µm to 0.2 µm. According to this semiconductor optical device, the dark current and the capacitance of the photodiode tends to decrease.

In the semiconductor optical device according to one embodiment, the side surface of the light-absorbing layer has an inclined surface toward the inside of the photodiode.

In the semiconductor optical device according to one embodiment, the optical waveguide may include a waveguide semiconductor multilayer. The waveguide semiconductor multilayer includes a lower cladding layer disposed on the substrate, a semi-insulating layer disposed on the lower cladding layer, a core layer disposed on the semi-insulating layer and an upper cladding layer disposed on the core layer. The lower cladding layer is composed of the same layer as the first cladding layer.

In the semiconductor optical device according to one embodiment, the waveguide semiconductor multilayer is in direct contact with the second end surface of the photodiode at a second butt-joint portion, and the buried layer is disposed on a side surface of the waveguide semiconductor multilayer and on the second butt-joint portion.

According to this semiconductor optical device, the waveguide semiconductor multilayer protects the second end surface of the photodiode. The protection by the waveguide semiconductor multilayer decreases the dark current related to the second end surface of the photodiode.

In the semiconductor optical device according to one embodiment, the semi-insulating layer may be composed of a III-V compound semiconductor doped with a transition metal. The semi-insulating layer may include a first portion and a second portion. The first portion may cover the first and second end surfaces of the photodiode, and the second portion may be disposed on the second region of the substrate.

According to this semiconductor optical device, the semi-insulating layer covers the first and second end surfaces of the photodiode. The covering with the semi-insulating layer composed of a III-V compound semiconductor doped with a transition metal further decreases the dark current related to the first and second end surfaces of the photodiode.

A method for producing a semiconductor optical device according to another embodiment includes the steps of (a) preparing a substrate including a first region and a second region; (b) forming an epitaxial wafer including a first semiconductor multilayer disposed on the first region of the substrate, and a second semiconductor multilayer disposed on the second region of the substrate, the first semiconductor multilayer including a first cladding layer, a light-absorbing layer, and a second cladding layer stacked in that order on the substrate; (c) forming a first mask on the epitaxial wafer, the first mask having a pattern defining a photodiode and a second pattern defining an optical waveguide; (d) forming a mesa structure in the first and second regions by etching the first semiconductor multilayer and the second semiconductor multilayer using the first mask; (e) forming a recessed side surface of the light-absorbing layer in the mesa structure by selectively etching the light-absorbing layer using a wet etching method; and (f) forming a buried layer composed of a III-V compound semiconductor doped with a transition metal on a side surface of the mesa structure.

According to this method for producing a semiconductor optical device (hereafter, referred to as a "production method"), the side surface of the light-absorbing layer is recessed with respect to the side surface of the first cladding layer. The recessed side surface is formed by selectively etching the light-absorbing layer using the wet etching method. Since the side surface of the light-absorbing layer is recessed with respect to the side surface of the first cladding layer, the distribution of an electric field that extends from the first cladding layer through the light-absorbing layer to the second cladding layer is constricted at the light-absorbing layer. This constriction is caused by the recessed side surface of the light-absorbing layer. The constriction of the electric field decreases the capacitance of the photodiode. The decrease in the capacitance contributes to improve the high frequency response of the photodiode. Furthermore, the buried layer composed of the III-V compound semiconductor doped with a transition metal is grown on the side surface of the mesa structure. The side surface of the photodiode is covered with the transition metal doped III-V compound semiconductor buried layer. Therefore, the covering with the III-V compound semiconductor buried layer decreases the dark current related to the side surface of the photodiode.

In the production method according to another embodiment, the wet etching in the step of forming the recessed side surface may be continued until the side surface of the light-absorbing layer inclines toward the inside of the photodiode.

The production method according to another embodiment may further include a step of growing an undoped III-V compound semiconductor layer on the transition metal doped III-V compound semiconductor buried layer.

According to this production method, the undoped III-V compound semiconductor layer on the transition metal doped III-V compound semiconductor buried layer contributes to a decrease in the dark current of the photodiode.

The findings of the present invention can be easily understood by considering the following detailed description with reference to the attached drawings which are illustrated as examples. Embodiments of a semiconductor optical device and a method for producing a semiconductor optical device will now be described with reference to the attached drawings. If possible, the same parts are designated by the same reference numerals.

Figure 2A:
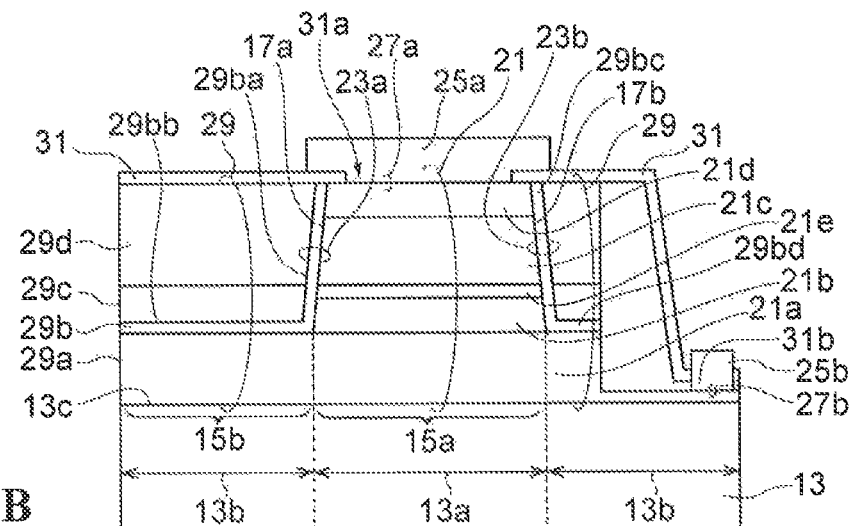
FIGS. 2A to 2C are sectional views of the semiconductor optical device according to the embodiment.
Figure 2B:
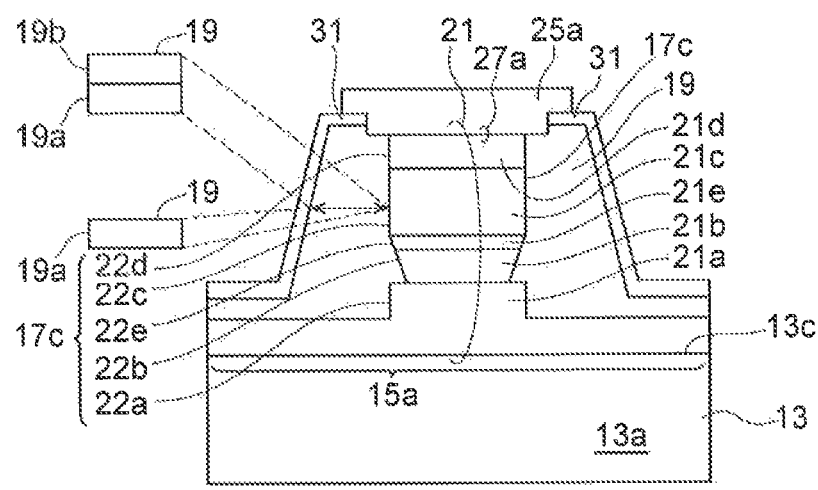
Figure 2C:
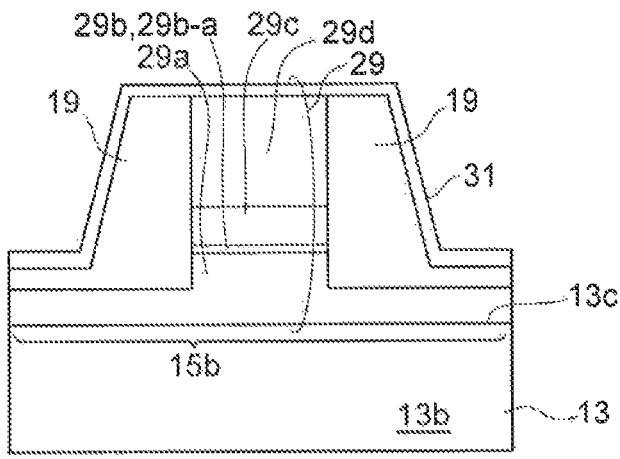

FIG. 1 is a plan view of a semiconductor optical device according to an embodiment. FIGS. 2A to 2C are sectional views of the semiconductor optical device according to the embodiment. FIG. 2A is a sectional view taken along line IIa-IIa of FIG. 1, FIG. 2B is a sectional view taken along line IIb-IIb of FIG. 1, and FIG. 2C is a sectional view taken along line IIc-IIc of FIG. 1.

Referring to FIG. 1, FIG. 2A, and FIG. 2B, a semiconductor optical device 11 includes a substrate 13, a photodiode 15a, an optical waveguide 15b, and a buried layer 19. The buried layer 19 is composed of a III-V compound semiconductor. As illustrated in FIG. 1, the substrate 13 includes a first region 13a and a second region 13b. The first region 13a and the second region 13b are arranged in a direction in which a first axis Ax1 extends.

The optical waveguide 15b is disposed on the second region 13b of the substrate 13, and the photodiode 15a is disposed on the first region 13a of the substrate 13. The photodiode 15a is a waveguide-type photodiode. The photodiode 15a has end surfaces (17a and 17b), which extend along a reference plane that intersects the first axis Ax1. The photodiode 15a also has side surfaces 17c, which extend in a direction in which the first axis Ax1 extends. Specifically, the photodiode 15a has a first end surface 17a, a second end surface 17b, and side surfaces 17c. The second end surface 17b is located opposite the first end surface 17a. The optical waveguide 15b is directly contact with the first end surface 17a of the photodiode 15a at a first butt-joint portion 23a.

The photodiode 15a includes a first semiconductor multilayer 21. The first semiconductor multilayer 21 is a stacked semiconductor layer. The first semiconductor multilayer 21 includes a first cladding layer 21a, a light-absorbing layer 21b and a second cladding layer 21c. The first cladding layer 21a, the light-absorbing layer 21b and the second cladding layer 21c are disposed on a principal surface 13c of the substrate 13 in that order. The first cladding layer 21a has a first conductivity type. The second cladding layer 21c has a second conductivity type. The light-absorbing layer 21b is disposed between the first cladding layer 21a and the second cladding layer 21c. The light-absorbing layer 21b receives light that propagates through the optical waveguide 15b, and generates photo carriers through photoelectric conversion. The first cladding layer 21a is disposed on the first region 13a of the substrate 13, the light-absorbing layer 21b is disposed on the first cladding layer 21a, and the second cladding layer 21c is disposed on the light-absorbing layer 21b.

The side surfaces 17c include a side surface 22a of the first cladding layer 21a, a side surface 22b of the light-absorbing layer 21b, and a side surface 22c of the second cladding layer 21c. The side surface 22b of the light-absorbing layer 21b is recessed with respect to the side surface 22a of the first cladding layer 21a. In this embodiment, the side surface 22b of the light-absorbing layer 21b is recessed with respect to the side surface 22c of the second cladding layer 21c. The side surface 22b of the light-absorbing layer 21b is inclined toward the inside of the photodiode 15a. The refractive index of the light-absorbing layer 21b is larger than those of the first cladding layer 21a and the second cladding layer 21c. Owing to the refractive-index profile provided by these three layers, the incident light from the optical waveguide is confined in the light-absorbing layer 21b. Furthermore, the band gap energy of the light-absorbing layer 21b is lower than those of the first cladding layer 21a and the second cladding layer 21c.

The buried layer 19 is disposed on the side surfaces 17c of the photodiode 15a. The buried layer 19 is disposed on a side surface of the first butt-joint portion 23a. The buried layer 19 includes a semi-insulating semiconductor layer 19a. The semi-insulating semiconductor layer 19a is composed of a III-V compound semiconductor doped with a transition metal. The semi-insulating semiconductor layer 19a covers the side surfaces 17c of the photodiode 15a. Alternatively, the buried layer 19 includes an undoped semiconductor layer 19b on the semi-insulating semiconductor layer 19a. The semi-insulating semiconductor layer 19a has a semi-insulating property. A transition metal such as iron (Fe) is added to the semi-insulating semiconductor layer 19a.

The operation of the photodiode 15a will be described. A reverse bias voltage is applied between the first cladding layer 21a and the second cladding layer 21c. In response to the reverse bias voltage, a depletion layer spreads in part or the entirety of the light-absorbing layer 21b. In this semiconductor optical device 11, the side surface 22b of the light-absorbing layer 21b is recessed with respect to the side surface 22a of the first cladding layer 21a. Thus, the distribution of an electric field that extends from the first cladding layer 21a to the second cladding layer 21c through the light-absorbing layer 21b is constricted at the light-absorbing layer 21b having the recessed side surface 22b. The constriction of the electric field decreases the capacitance of the photodiode 15a. Furthermore, the side surfaces 17c of the photodiode 15a are covered with the buried layer 19 doped with a transition metal. The covering with the buried layer 19 decreases the dark current related to the side surfaces 17c of the photodiode 15a.

In the semiconductor optical device 11, the first semiconductor multilayer 21 further includes a contact layer 21d. The contact layer 21d is disposed on the second cladding layer 21c. The contact layer 21d has the same conductivity type as that of the second cladding layer 21c. The side surface 17c may include a side surface 22d of the contact layer 21d. The semiconductor optical device 11 includes a first electrode 25a that makes a contact 27a with the contact layer 21d. The semiconductor optical device 11 includes a second electrode 25b that makes a contact 27b with the first cladding layer 21a.

In this embodiment, the first semiconductor multilayer 21 includes a graded layer 21e disposed between the light-absorbing layer 21b and the second cladding layer 21c. The side surfaces 17c include a side surface 22e of the graded layer 21e. The graded layer 21e is composed of a III-V compound semiconductor. The composition of the graded layer 21e is changed in a thickness direction. In the composition change, the composition of group III elements or group V elements changes gradually or stepwise in a direction from the second cladding layer 21c to the light-absorbing layer 21b. With this composition change, the refractive index profile changes in the direction from the second cladding layer 21c to the light-absorbing layer 21b. This composition change increases an effect of the optical confinement in the light-absorbing layer, which advantageously achieves higher-efficiency of photoelectric conversion. Furthermore, with this composition change, the band gap energy of the graded layer 21e changes gradually or stepwise in a direction from the second cladding layer 21c to the light-absorbing layer 21b. The thickness of the graded layer 21e is preferably smaller than that of the light-absorbing layer 21b. If the thickness of the graded layer 21e is excessively large, the transit time (time until photo carriers generated in the light-absorbing layer reach to an electrode) is increased. The increased transit time degrades the high frequency response of the photodiode 15a.

The first semiconductor multilayer 21 for the photodiode 15a is exemplified below.
Substrate 13: Fe doped semi-insulating InP substrate, the orientation of a principal surface is a (100) plane
First cladding layer 21a: Si doped InP, thickness 1.5 μm
Light-absorbing layer 21b: InGaAs, thickness 0.5 μm
Graded layer 21e: $In_XGa_{1-X}As_YP_{1-Y}$ (0<X<1, 0≤Y<1), thickness 0.05 to 0.2 μm
Second cladding layer 21c: Zn doped InP, thickness 1 μm
Contact layer 21d: p-InGaAs, thickness 0.3 μm
Buried layer 19: Fe doped InP, thickness 0.4 to 1.5 μm
First electrode 25a (p-side electrode): AuZn
Second electrode 25b (n-side electrode): AuGeNi
First axis Ax1: direction of <011> axis The graded layer 21e includes the following structure.
An Example of Stepwise Changing Structure
Multiple layers of Zn doped InGaAsP: for example, five semiconductor layers are stacked, and the band-gap wavelengths of the first to fifth InGaAsP layers are respectively 1.3 μm, 1.2 μm, 1.15 μm, 1.1 μm, and 1.05 μm from the side close to the light-absorbing layer.

An Example of Gradually Changing Structure
An InGaAsP layer having a continuous composition gradient: the band-gap wavelength of the InGaAsP layer continuously changes from 1.05 μm to 1.3 μm in a direction from the second cladding layer to the light-absorbing layer.

The optical waveguide 15b includes a second semiconductor multilayer 29 for the optical waveguide 15b. The second semiconductor multilayer 29 includes a lower cladding layer 29a, a semi-insulating layer 29b, a core layer 29c, and an upper cladding layer 29d. The lower cladding layer 29a, the semi-insulating layer 29b, the core layer 29c, and the upper cladding layer 29d are disposed on the second region 13b of the substrate 13 in that order. In this embodiment, the lower cladding layer 29a is grown together with the first cladding layer 21a. The lower cladding layer 29a is the same semiconductor layer as the first cladding layer 21a. The semi-insulating layer 29b includes a III-V compound semiconductor layer doped with a transition metal. As illustrated in FIG. 1 and FIG. 2A, the semi-insulating layer 29b includes a first portion 29ba and a second portion 29bb. The first portion 29ba is disposed between the first end surface 17a of the photodiode 15a and the end of the optical waveguide 15b. The second portion 29bb is disposed on the lower cladding layer 29a in the second region 13b of the substrate 13. The semi-insulating layer 29b also includes a third portion 29bc and a forth portion 29bd. The third portion 29bc is disposed on the second end surface 17b of the photodiode 15a. The fourth portion 29bd is disposed on the first cladding layer 21a in the second region 13b of the substrate 13. In this semiconductor optical device 11, the first portion 29ba and the third portion 29bc of the semi-insulating layer 29b cover the first end surface 17a and the second end surface 17b of the photodiode 15a, respectively. The covering with the III-V compound semiconductor layer (semi-insulating layer 29b) doped with a transition metal decreases the dark current related to the end surfaces of the photodiode 15a.

As illustrated in FIG. 2C, the side surfaces of a waveguide mesa for the optical waveguide 15b are covered with the buried layer 19 composed of a III-V compound semiconductor.

The second semiconductor multilayer 29 is exemplified below.
Lower cladding layer 29a: Si doped InP, thickness 1.5 μm
Semi-insulating layer 29b: Fe doped InP, Fe concentration $5 \times 10^{16}$ $cm^{-3}$, thickness 0.05 μm
Core layer 29c: undoped InGaAsP, thickness 0.5 μm, the composition is determined by a band-gap wavelength of 1.05 μm
Upper cladding layer 29d: undoped InP, thickness 1 μm The second semiconductor multilayer 29 is disposed so as to directly contact with the first end surface 17a of the photodiode 15a at the first butt-joint portion 23a. The second semiconductor multilayer 29 is further disposed so as to directly contact with the other end surface (second end surface 17b) of the photodiode 15a at a second butt-joint portion 23b. The second end surface 17b is located opposite the first end surface 17a. A semi-insulating semiconductor layer 19a (buried layer 19) is disposed on the side surfaces of the second semiconductor multilayer 29. In this semiconductor optical device 11, the second semiconductor multilayer 29 for the optical waveguide covers the first end surface 17a and the second end surface 17b of the photodiode 15a. The covering with the second semiconductor multilayer 29 for the optical waveguide decreases the dark current related to the end surfaces of the photodiode 15a.

The substrate 13, the buried layer 19, the first semiconductor multilayer 21, and the second semiconductor multilayer 29 are covered with an protective layer 31. The protective layer 31 has openings 31a and 31b. The openings 31a and 31b allow the first electrode 25a and the second electrode 25b to contact with conductive semiconductor layers, respectively.

As described above, the side surface 22b of the light-absorbing layer 21b is recessed with respect to the side surface 22a of the first cladding layer 21a. Referring to FIG. 2B, the recess of the light-absorbing layer 21b at the side surface 22b provides an inverted mesa structure. On the side surfaces 17c of the photodiode 15a, the side surface 22b of the light-absorbing layer 21b has an inverted mesa structure. Therefore, the joined area in which the first cladding layer 21a and the light-absorbing layer 21b are in contact is smaller than that of the upper surface of the first cladding layer 21a. When an electric field is applied, the electric line of force penetrates through the light-absorbing layer 21b in a direction from the first cladding layer 21a to the second cladding layer 21c. The electric line of force passes through the reduced joined area. Thus, a capacitor constituted by the first cladding layer 21a, the depletion layer in the light-absorbing layer 21b, and the second cladding layer 21c has a small capacitance, which decreases in accordance with the reduction in the joined area.

As illustrated in FIG. 2B, the inverted mesa structures on the side surfaces 17c are formed on both the side surface 22e of the graded layer 21e and the side surface 22b of the light-absorbing layer 21b. The side surface 22e of the graded layer 21e is recessed with respect to the side surface 22c of the second cladding layer 21c. The presence of the graded layer 21e on the light-absorbing layer 21b makes it easy to recess the side surface 22b of the light-absorbing layer 21b. The recess of the light-absorbing layer 21b is helpful in decreasing the capacitance of the photodiode 15a. The graded layer 21e on the light-absorbing layer 21b assists the formation of the recess during wet-etching process for forming the inverted mesa structure. The recess of the light-absorbing layer 21b at the side surface 22b is further helpful in decreasing the dark current. The inverted mesa structure on the side surface 22e of the graded layer 21e and the side surface 22b of the light-absorbing layer 21b provides the following effects. That is, the buried layer 19 thoroughly covers the side surface 22b of the light-absorbing layer 21b, and the buried layer 19 composed of semi-insulating semiconductor contacts the side surface 22b of the light-absorbing layer 21b. The recess reduces the leakage of the electric line of force from the light-absorbing layer. Furthermore, the covering with the semi-insulating semiconductor layer decreases the dark current related to the side surface of the first semiconductor multilayer 21.

Figure 3:
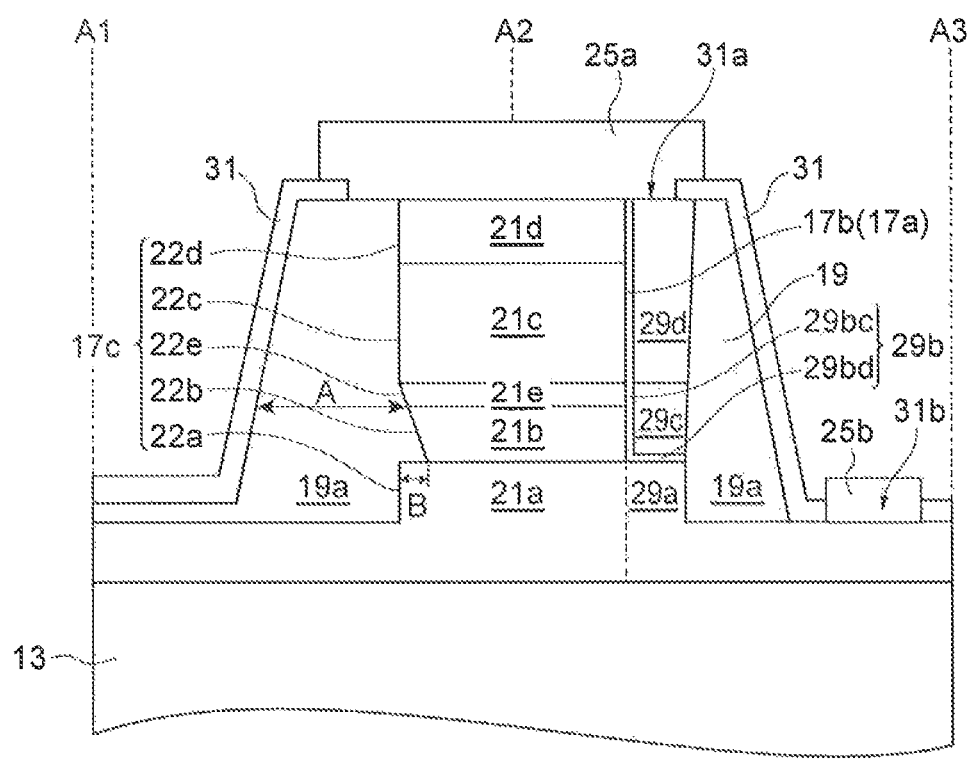
FIG. 3 illustrates an embodiment of a photodiode taken along line III-III of FIG. 1.

FIG. 3 illustrates an embodiment of a photodiode taken along line III-III of FIG. 1. In the embodiment illustrated in FIG. 3, the thickness of the semi-insulating semiconductor layer 19a at the upper end of the light-absorbing layer 21b (defined as the symbol "A" illustrated in FIG. 3) is preferably 1.5 µm or less to avoid an increase in the capacitance. The semi-insulating semiconductor layer 19a covers the side surfaces 22a, 22b, 22e, 22c, and 22d. If the buried layer 19 doped with a transition metal is thick on the side surfaces of the photodiode 15a, the high-frequency characteristics of the photodiode 15a are degraded. The reason for this is as follows. When a thick buried layer is formed, the heating time (time for epitaxial growth) for forming the buried layer is lengthened. As a result, Zn doped into the second cladding layer 21c diffuses into the light-absorbing layer 21b. This decreases the width of the depletion layer formed in the light-absorbing layer 21b and thus degrades the high-frequency characteristics. The thickness of the buried layer 19 is preferably 0.4 µm or more at the upper end of the light-absorbing layer 21b to avoid an increase in the dark current. If the buried layer 19 is thin on the side surfaces of the photodiode 15a, the dark current of the photodiode increases.

Figure 4:
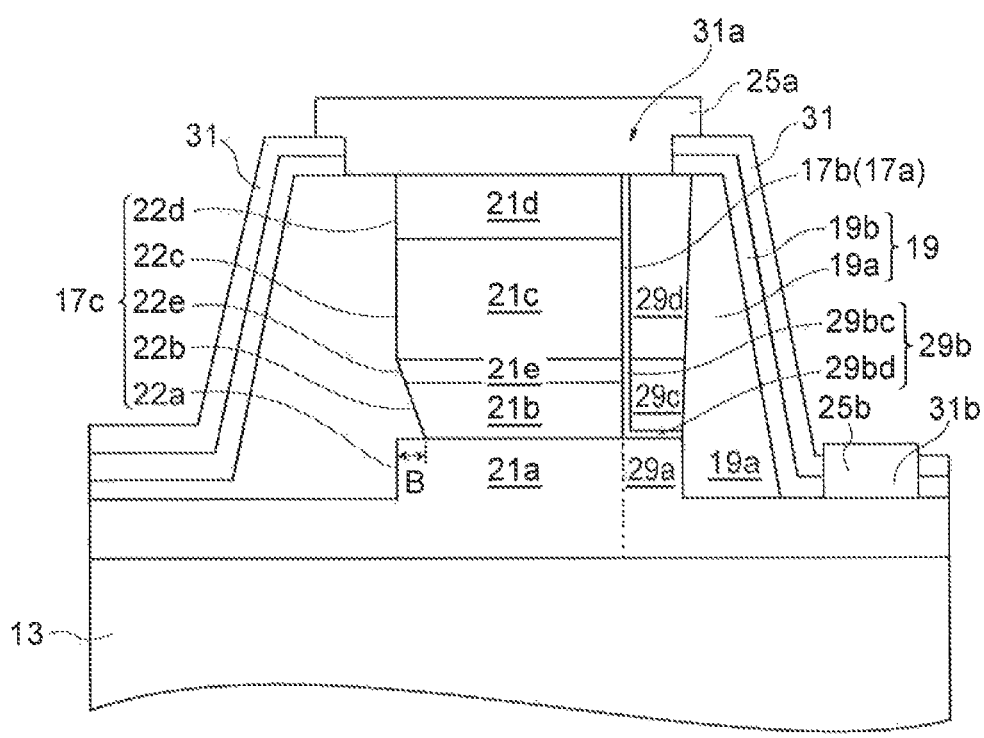
FIG. 4 illustrates another embodiment of a photodiode taken along line III-III of FIG. 1.

FIG. 4 illustrates another embodiment of a photodiode taken along line III-III of FIG. 1. In the embodiment illustrated in FIG. 4, the undoped semiconductor layer 19b is preferably disposed on the semi-insulating semiconductor layer 19a. The undoped semiconductor layer 19b (undoped III-V compound semiconductor buried layer) contributes to a decrease in the dark current of the photodiode.

Example 1

A semiconductor substrate composed of a III-V compound semiconductor, such as an InP substrate, is used as the substrate 13. The principal surface of the semiconductor substrate has a (100) plane of the III-V compound semiconductor. A photodiode and an optical waveguide are disposed on the substrate and are optically coupled each other. The photodiode and the optical waveguide are butt-jointed and arranged, for example, in a direction of the <011> axis of the III-V compound semiconductor. The photodiode and the optical waveguide are in direct contact with each other. The optical waveguide is formed, for example, in a stripe shape with a width of 2.5 µm. The width of the optical waveguide is increased to the width of the photodiode at a joint section where the photodiode and the optical waveguide are in direct contact. The optical waveguide includes the joint section and a light propagating section. The light propagating section is connected to the joint section. Side surfaces of the optical waveguide are covered with an Fe doped semiconductor buried layer at the joint section. The buried layer is composed of a III-V compound semiconductor layer doped with Fe. Both the side surfaces and the upper surface of the optical waveguide are covered with an insulating layer at the light propagating section away from the photodiode. The insulating layer is, for example, a SiN layer.

The photodiode has, for example, a rectangular mesa shape with a width of 10 µm and a length of 20 µm. The front end surface and rear end surface of the photodiode are in contact with a semiconductor multilayer for the optical waveguide through an Fe doped buffer layer included in the semiconductor multilayer for the optical waveguide. The Fe doped buffer layer is a III-V compound semiconductor layer doped with Fe. The semiconductor multilayer for the optical waveguide have the same width as the photodiode at the rear end surfaces of the photodiode. Both the side surfaces of the photodiode are directly covered with the buried layer. A p-side electrode is disposed on an upper surface of the photodiode.

The photodiode according to this example includes a plurality of semiconductor layers disposed on the principal surface of a semi-insulating substrate (SI—InP substrate). The semiconductor layers for the photodiode are as follows; n-type cladding layer (Si doped InP, thickness 1.5 µm), light-absorbing layer (InGaAs), p-type cladding layer (Zn doped InP, Zn concentration $1 \times 10^{18}$ cm$^{-3}$, thickness 1 µm), and p-type contact layer (p-InGaAs, Zn concentration $1 \times 10^{19}$ cm$^{-3}$, thickness 0.3 µm). The photodiode includes a p-side electrode on the upper surface thereof. The optical waveguide includes a plurality of semiconductor layers disposed on the semi-insulating substrate. The semiconductor layers for the optical waveguide are as follows; n-type cladding layer (Si doped InP, thickness 1.5 µm) which is shared by the photodiode, Fe doped buffer layer (Fe—InP, Fe concentration $5 \times 10^{16}$ cm$^{-3}$, thickness 0.05 µm), core layer (undoped InGaAsP, band-gap wavelength 1.05 µm, thickness 0.5 µm), and upper cladding layer (undoped InP, thickness 1 µm).

The Fe doped buffer layer covers the n-type cladding layer of the optical waveguide and covers the end surfaces of the photodiode. In this example, the Fe concentration of the Fe doped buffer layer is $5 \times 10^{16}$ cm$^{-3}$. In this Fe concentration, the surface roughness which supposedly occurs when the Fe concentration exceeds the saturated concentration is not observed. When the Fe concentration is $1 \times 10^{17}$ cm$^{-3}$, surface roughness is generated not only on the surface of the Fe doped buffer layer, but also on the side surfaces of the waveguide mesa and the photodiode mesa. This may be because the segregation of Fe affects the dry-etching of the waveguide mesa and the photodiode mesa.

The front end surface and rear end surface of the photodiode are slightly inclined relative to a vertical direction. The Fe doped buffer layer and the core layer are grown on the inclined surfaces. As a result, a thin Fe doped buffer layer and a thin core layer climb the front end surface and the rear end surface. An Fe doped buffer layer and a core layer are grown at the boundary between the front end surface of the photodiode and the multilayer for the optical waveguide. The Fe doped buffer layer and the core layer are also grown at the boundary between the rear end surface of the photodiode and the multilayer for the optical waveguide. The Fe doped buffer layer and the core layer at the boundary are respectively thinner than the Fe doped buffer layer and the core layer of the optical waveguide.

The front end surface and rear end surface of the photodiode are covered with the thin Fe doped buffer layer as illustrated in FIG. 2A. Iron (Fe) in the thin Fe doped buffer layer and zinc (Zn) in the p-type semiconductor layer of the photodiode interdiffuse at the boundary of the butt-joint. Defects are formed by the etching for forming the photodiode mesa on the front end surface and rear end surface of the photodiode. Zinc that has diffused from the p-type cladding layer and the p-type contact layer compensates for the defects. This can decrease the dark current related to the front end surface and rear end surface of the photodiode.

The side surfaces of the photodiode are recessed at the light-absorbing layer with respect to the upper end of the side surfaces of the n-type cladding layer as illustrated in FIG. 2B. Specifically, the side surfaces of the light-absorbing layer have an inverted mesa structure. Since the light-absorbing layer has the inverted mesa structure and thus the light-absorbing layer is recessed, the distribution of the electric line of force (electric line of force generated in a direction from the p-type cladding layer to the n-type cladding layer) is narrowed around the recess. Thus, high frequency response favorable for the photodiode is achieved.

The side surfaces of the photodiode mesa are covered with the buried layer (Fe doped InP buried layer). In this example, the Fe concentration is $5 \times 10^{16}$ cm$^{-3}$. In the growth of the buried layer, the thickness of the buried layer is large at the bottom of the photodiode mesa and gradually decreases toward the upper portion of the photodiode mesa. In this example, the thickness of the Fe doped InP buried layer is 0.4 µm at the upper end of the light-absorbing layer.

Figure 5:
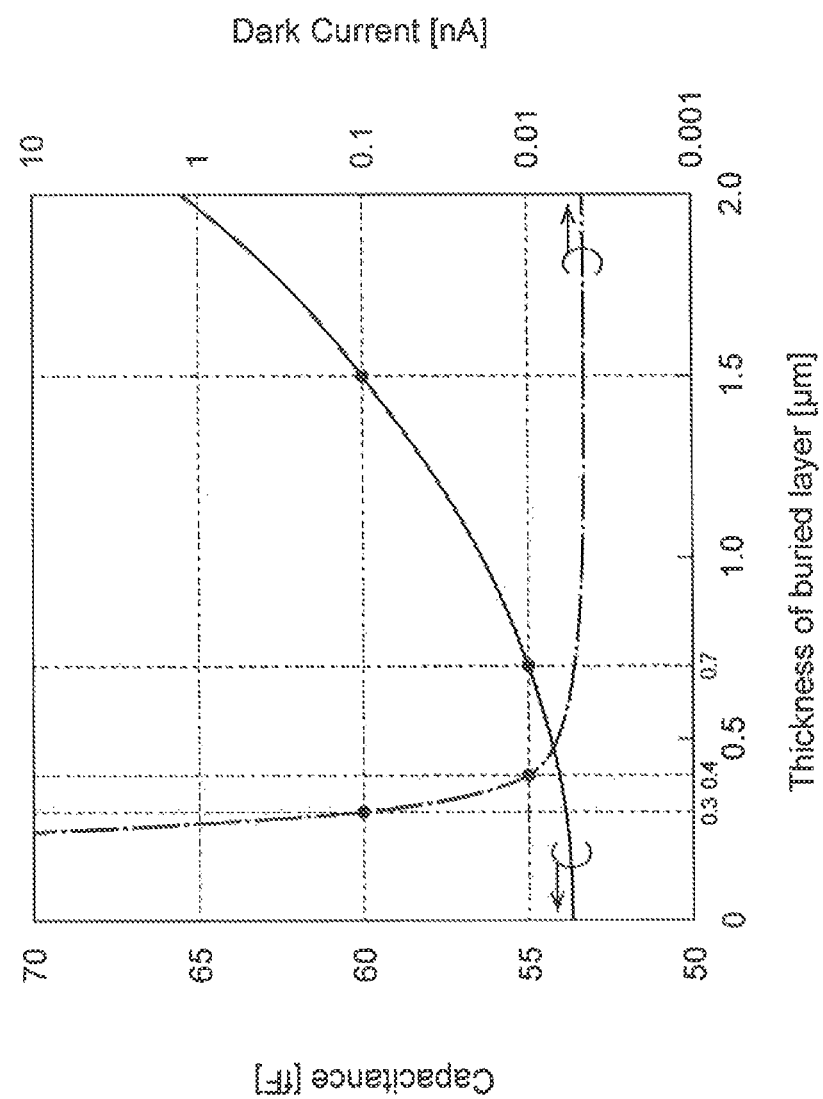
FIG. 5 shows the relationship between the thickness of the buried layer and the dark current and capacitance of a photodiode.

The inventors have made a plurality of prototype photodiodes including Fe doped InP buried layers having several thicknesses and have measured the dark current of the photodiodes. FIG. 5 shows the relationship between the thickness of the Fe doped InP buried layer and the dark current. FIG. 5 also shows the relationship between the thickness of the buried layer and capacitance of the photodiode. As shown in FIG. 5, the dark current decreases as the thickness of the Fe doped InP buried layer increases. For example, the dark current of the photodiode including an Fe doped InP buried layer having a thickness of 0.4 µm is lower than that of the photodiode including an Fe doped InP buried layer having a thickness of 0.25 µm by about one to two orders of magnitude on average. In contrast, as shown in FIG. 5, the capacitance of the photodiode increases as the thickness of the Fe doped InP buried layer increases. For example, the capacitance can be set to 60 fF or less in the photodiode including an Fe doped InP buried layer having a thickness of 1.5 µm or less. Furthermore, the capacitance can be set to 55 fF or less in the photodiode including buried layer having a thickness of 0.7 µm or less. Therefore, high-speed response can be achieved with a thin buried layer. Considering the tendencies of dark current and capacitance, the thickness of the Fe doped InP buried layer may be, for example, 0.4 µm or more and 1.5 µm or less.

The dark current can be further decreased by disposing an undoped InP buried layer on the surface of the Fe doped InP buried layer. The dark current of the photodiode including an undoped InP buried layer having a thickness of 0.1 µm on the surface of the Fe doped InP buried layer having a thickness of 0.25 µm is substantially equal to the dark current of the photodiode including an Fe doped InP buried layer having a thickness of 0.4 µm. The contact between the Fe doped InP layer and the Zn doped semiconductor layer causes interdiffusion of iron and zinc. If the interdiffusion proceeds to the degree that zinc reaches the surface of the buried layer, the dark current is believed to rather increase. To avoid the delivery of zinc to the surface, it is effective that the undoped InP buried layer is grown on the Fe doped InP buried layer. A thick undoped InP buried layer degrades the high frequency response of the photodiode. Therefore, a combination of the Fe doped InP buried layer serving as a lower layer and the undoped InP buried layer serving as an upper layer is suitable for both achieving the high frequency response and decreasing the dark current.

Figure 6:
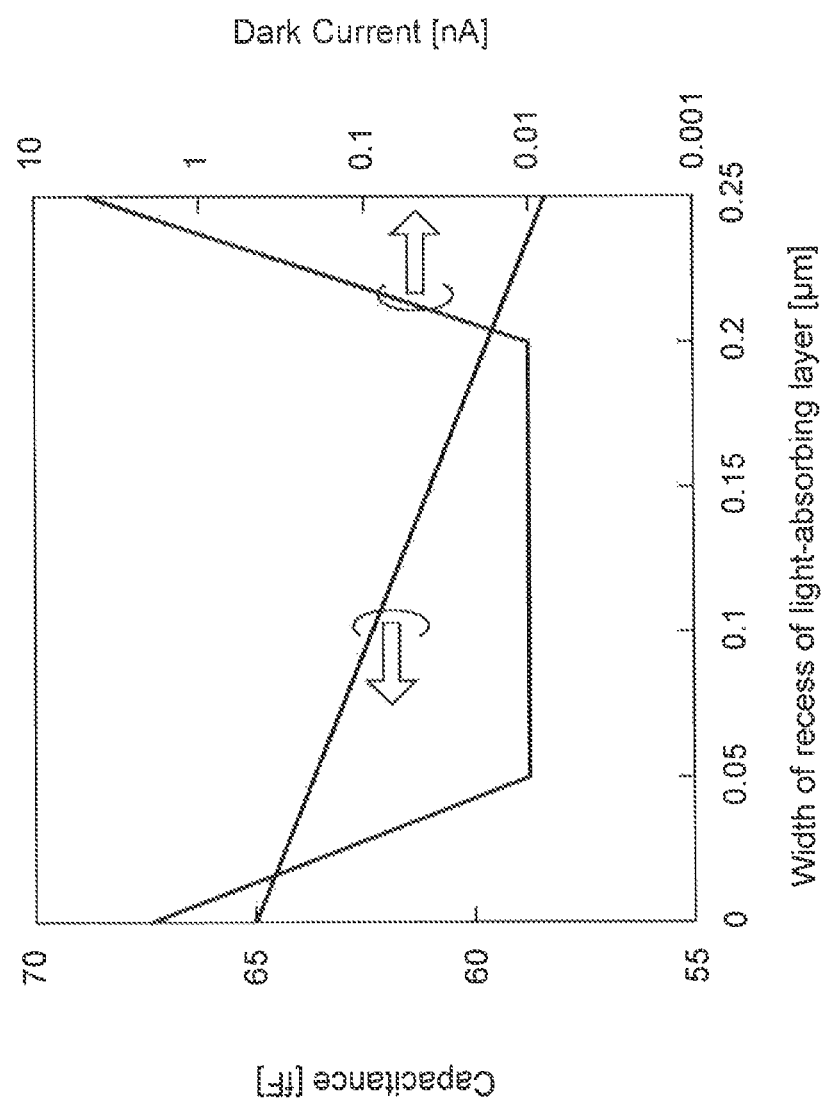
FIG. 6 shows the relationship between the width of recess of a light-absorbing layer and the dark current and capacitance of a photodiode.

FIG. 6 shows the relationship between the width of the recess of the light-absorbing layer and the dark current of the photodiode. The relationship between the width of the recess and capacitance of the photodiode is also shown in FIG. 6. The width of the recess of the light-absorbing layer means the amount of the recess of the recessed portion of the light-absorbing layer. The width of the recess of the light-absorbing layer is defined as the symbol "B" illustrated in FIG. 3 and FIG. 4. The symbol "B" indicates the distance between the lower end of the light-absorbing layer and the edge of the upper surface of the first cladding layer at the side surface of the photodiode. In the range of the width of the recess smaller than 0.05 µm, the dark current decreases as the width of the recess of the light-absorbing layer increases. The dark current increases as the width of the recess increases in the range of the width of the recess larger than 0.2 µm. The capacitance of the photodiode monotonously decreases as the width of the recess increases. Considering the tendencies of dark current and capacitance, the width of the recess of the light-absorbing layer may be, for example, 0.05 µm or more and 0.2 µm or less.

Principal steps in a method for producing the semiconductor optical device will be described with reference to FIG. 7A to FIG. 13C. In this production method, a substrate has a plurality of device sections on its principal surface.

Each section has a semiconductor optical device or a plurality of the semiconductor optical devices. The semiconductor optical devices arranged on the substrate are produced all together. FIG. 7A to FIG. 13C each illustrate a device in one device section. Although the shapes of components for semiconductor optical devices change in accordance with the progress of the production method, same numerals as the semiconductor optical device 11 illustrated in FIG. 1 and FIGS. 2A to 2C are used to facilitate the understanding. In FIG. 7A to FIG. 13C, a rectangular coordinate system S is illustrated.

The semiconductor optical device including a photodiode and an optical waveguide according to this embodiment may be applied to a coherent optical demodulator. When the semiconductor optical device includes a photodiode having a low dark current and good high-frequency characteristics and includes a 90-degree optical hybrid device as a monolithically integrated optical waveguide, a good coherent optical demodulator can be realized.

Figure 7A:
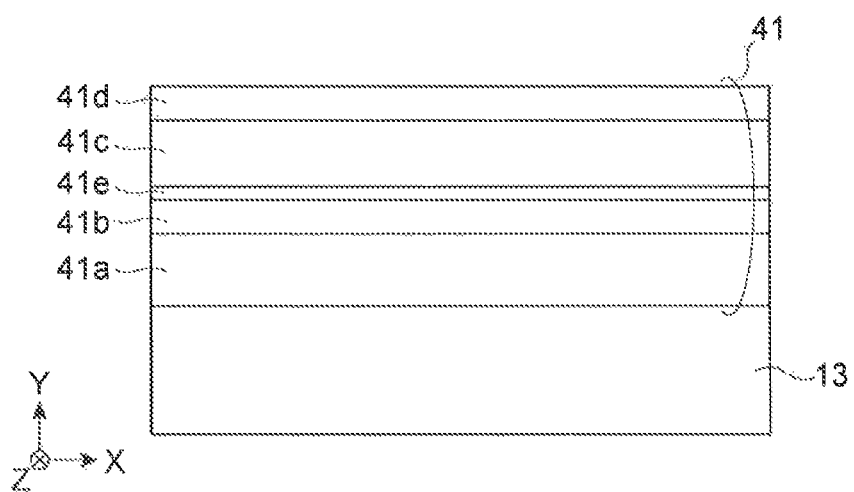
FIGS. 7A and 7B illustrate steps in a method for producing a semiconductor optical device according to this embodiment.
Figure 7B:
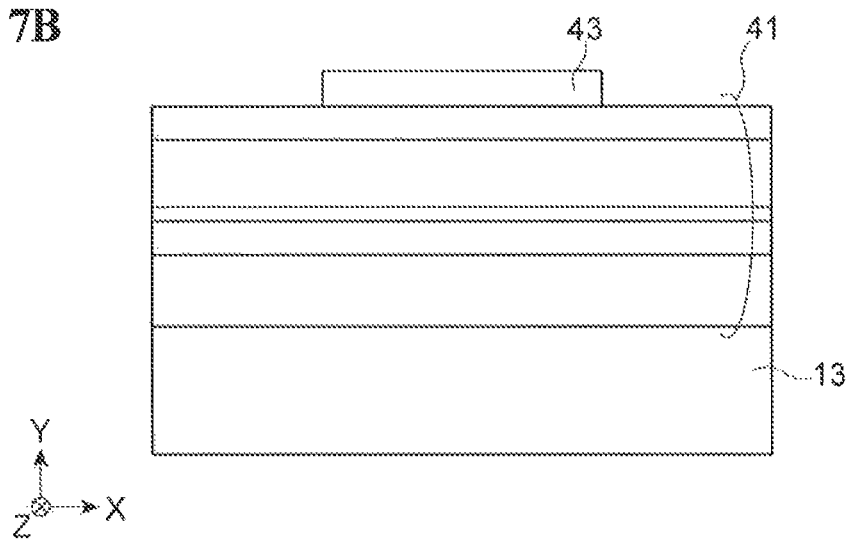

As illustrated in FIG. 7A, a substrate 13 (e.g., semi-insulating InP substrate) is prepared. The substrate 13 includes a first region 13a on which a photodiode is to be formed and a second region 13b on which an optical waveguide is to be formed. A semiconductor multilayer 41 for the photodiode is grown on the entire principal surface of the substrate 13. The semiconductor multilayer 41 is formed on the first region 13a and the second region 13b of the substrate 13. The semiconductor multilayer 41 includes a semiconductor layer 41a for a first cladding layer 21a, a semiconductor layer 41b for a light-absorbing layer 21b, a semiconductor layer 41e for a graded layer 21e, a semiconductor layer 41c for a second cladding layer 21c, and a semiconductor layer 41d for a contact layer 21d. These layers are grown by, for example, an organo-metallic vapor phase epitaxy (OMVPE) method. Subsequently, as illustrated in FIG. 7B, a mask 43 that defines the length of a photodiode mesa in X direction (a first direction) is formed on the surface of the semiconductor multilayer 41. For example, the mask 43 is formed as follows: an insulating layer (e.g., SiN layer) is deposited on the semiconductor layer 41d, and then photolithography and etching are performed on the insulating layer to form the mask 43 having a desired pattern.

Figure 8A:
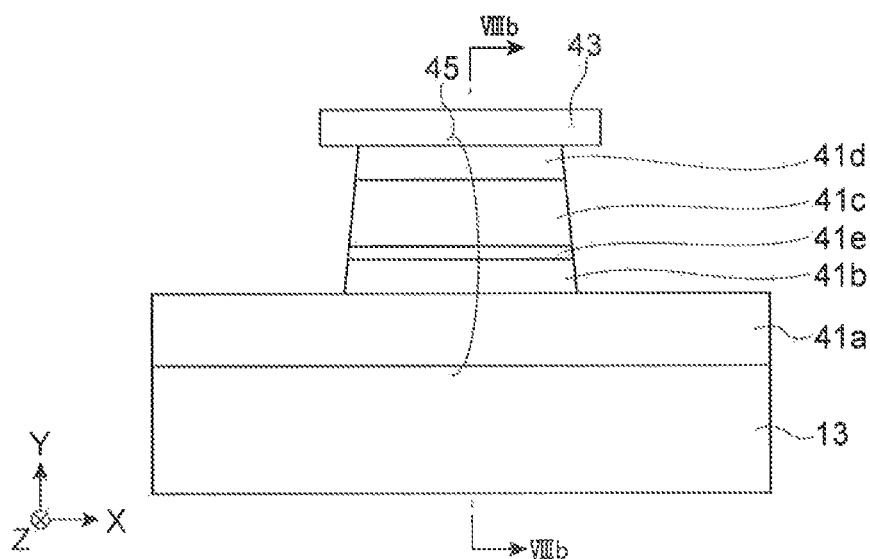
FIGS. 8A and 8B illustrate steps in the method for producing a semiconductor optical device according to this embodiment.
Figure 8B:
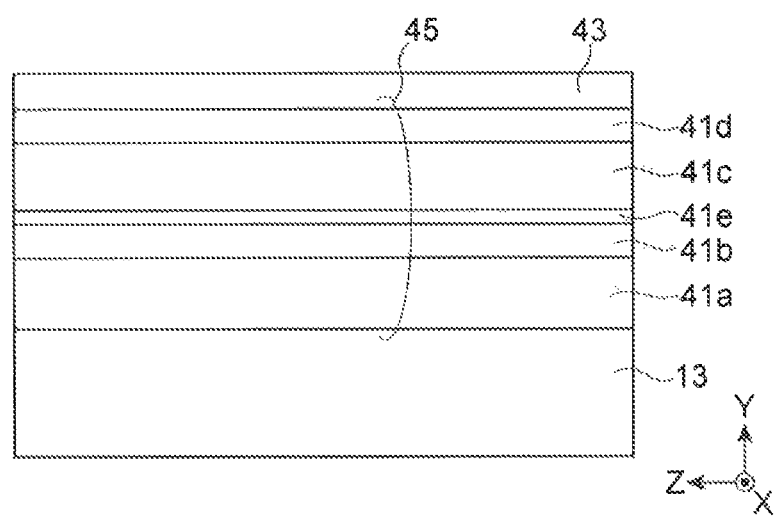

As illustrated in FIG. 8A, the semiconductor multilayer 41 is etched using the mask 43. Semiconductor layers from the semiconductor layer 41d to the semiconductor layer 41b are patterned. The semiconductor layer 41a for the first cladding layer 21a is left without being patterned. Thus, a first semiconductor multilayer 45 for a photodiode is formed on the first region 13a of the substrate 13. The mesa-shaped first semiconductor multilayer 45 has a first end surface and a second end surface which are formed by the etching. FIG. 8B is a sectional view taken along line VIIIb-VIIIb of FIG. 8A (in a direction in which the mask 43 extends) as understood from the directions of the rectangular coordinate system. This etching is performed by wet etching that uses a typical etchant. As a result of the wet etching of the semiconductor multilayer 41, the first end surface and second end surface of the photodiode mesa have a normal mesa structure.

Figure 9A:
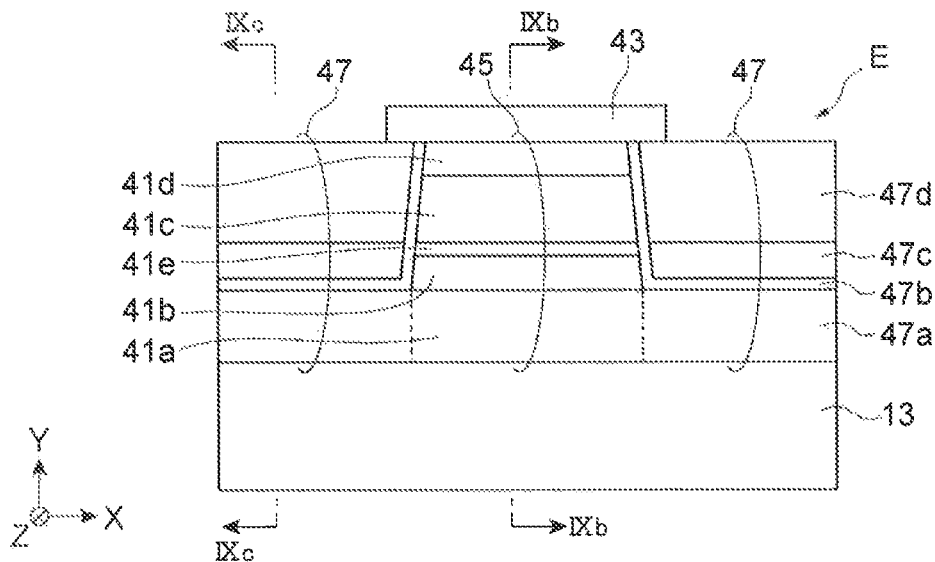
FIGS. 9A to 9C illustrate steps in the method for producing a semiconductor optical device according to this embodiment.
Figure 9B:
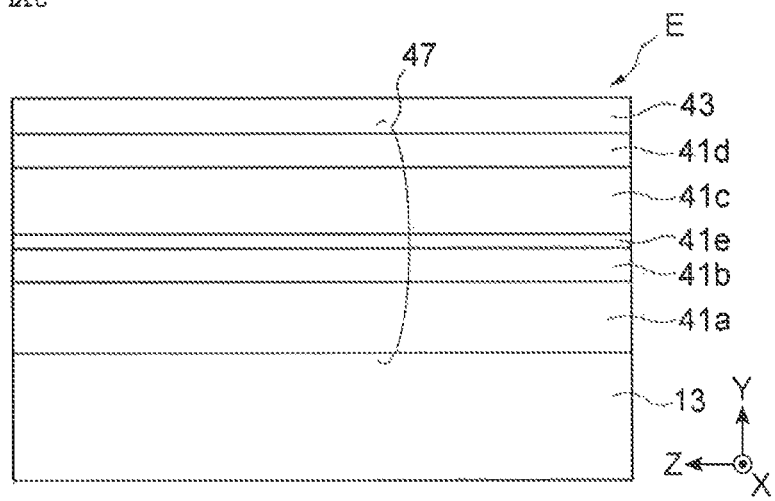
Figure 9C:
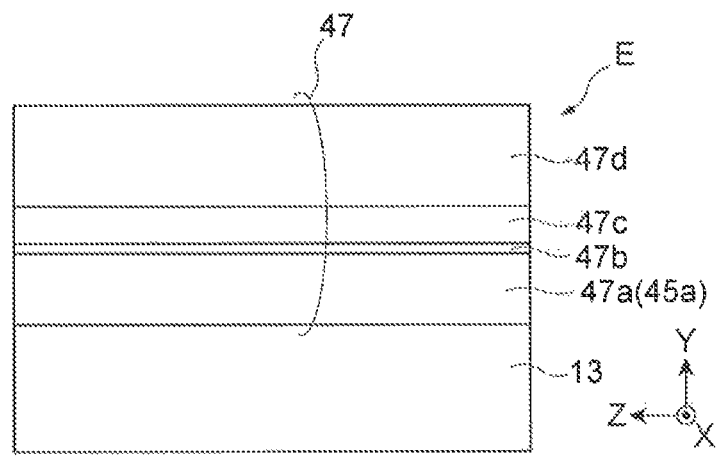

As illustrated in FIG. 9A, regrowth is performed using the mask 43 to form a second semiconductor multilayer 47 for the optical waveguide. The second semiconductor multilayer 47 is formed on the second region 13b of the substrate 13. The second semiconductor multilayer 47 is formed by sequentially growing a semiconductor layer 47b for a semi-insulating layer 29b, a semiconductor layer 47c for a core layer 29c, and a semiconductor layer 47d for an upper cladding layer 29d. In this embodiment, the semiconductor layer 41a for the first cladding layer 21a also serves as a lower cladding layer 29a. The semiconductor layer 47b for the semi-insulating layer 29b is thinly grown on the first end surface and the second end surface of the first semiconductor multilayer 45. The semiconductor layer 47c for the core layer 29c climbs along the first end surface and the second end surface. FIG. 9B is a sectional view taken along line IXb-IXb of FIG. 9A. FIG. 9C is a sectional view taken along line IXc-IXc of FIG. 9A.

Through the above processes, an epitaxial wafer E has been produced. The epitaxial wafer E includes the first semiconductor multilayer 45 for the photodiode disposed on the first region 13a of the substrate 13 and the second semiconductor multilayer 47 for the optical waveguide disposed on the second region 13b of the substrate 13. The first semiconductor multilayer 45 includes the semiconductor layer 41a for the first cladding layer 21a, the semiconductor layer 41b for the light-absorbing layer 21b, the semiconductor layer 41e for the graded layer 21e, the semiconductor layer 41c for the second cladding layer 21c, and the semiconductor layer 41d for the contact layer 21d. These semiconductor layers (41a, 41b, 41e, 41c, and 41d) are disposed on the first region 13a of the substrate 13. The second semiconductor multilayer 47 includes the semiconductor layer 47a for the lower cladding layer, the semiconductor layer 47b for the semi-insulating layer 29b, the semiconductor layer 47c for the core layer 29c, and the semiconductor layer 47d for the upper cladding layer 29d. These semiconductor layers (47a, 47b, 47c, and 47d) are disposed on the second region 13b of the substrate 13.

The mask 43 used for the regrowth is removed. After the removal, a first mask 49 is formed on the epitaxial wafer E. The first mask 49 has a first pattern that defines the photodiode 15a, and a second pattern that defines the optical waveguide 15b.

For example, the first mask 49 is formed as follows: an insulating layer (e.g., SiN layer) is deposited on the semiconductor layer 41d and on the semiconductor layer 47d, and then photolithography and etching are performed on the insulating layer to form a first mask 49 having the first and second patterns.

Figure 10A:
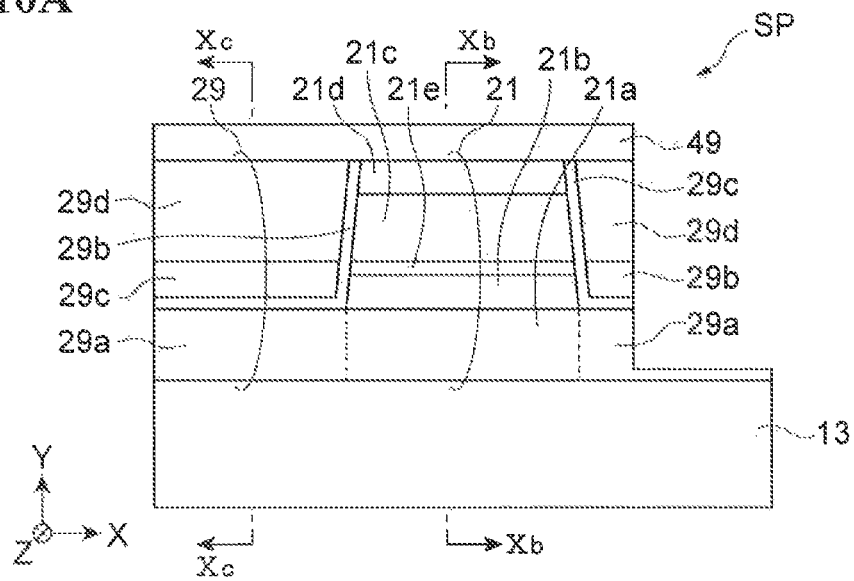
FIGS. 10A to 10C illustrate steps in the method for producing a semiconductor optical device according to this embodiment.
Figure 10B:
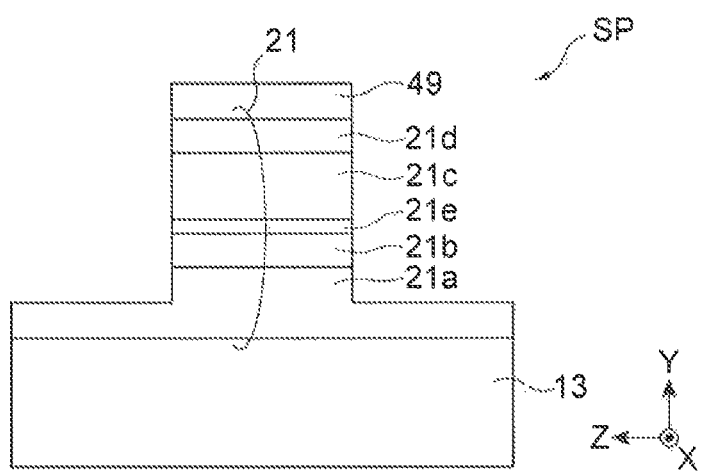
Figure 10C:
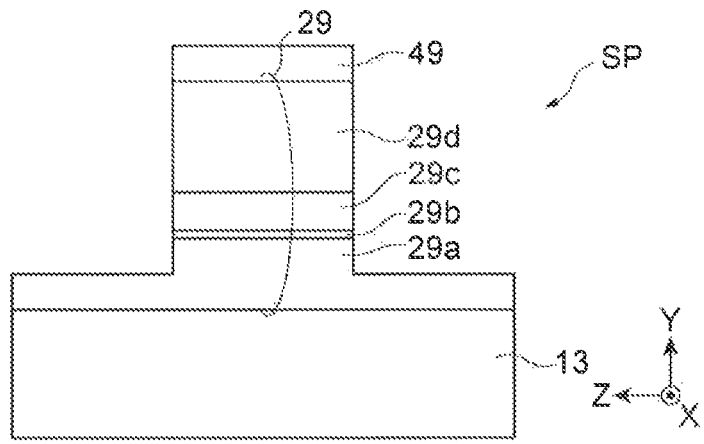

Subsequently, the first semiconductor multilayer 45 and the second semiconductor multilayer 47 are etched using the first mask 49 to produce a mesa structure in the first and second regions of the substrate. This etching is performed by dry etching such as typical reactive ion etching. After the etching using the first mask 49, a substrate product SP illustrated in FIG. 10A is obtained. The substrate product SP includes the mesa structure in the first and second regions of the substrate. The substrate product SP includes a first semiconductor multilayer 21 for a photodiode 15a and a second semiconductor multilayer 29 for an optical waveguide 15b. FIG. 10B is a sectional view taken along line Xb-Xb of FIG. 10A. FIG. 10C is a sectional view taken along line Xc-Xc of FIG. 10A.

Figure 11A:
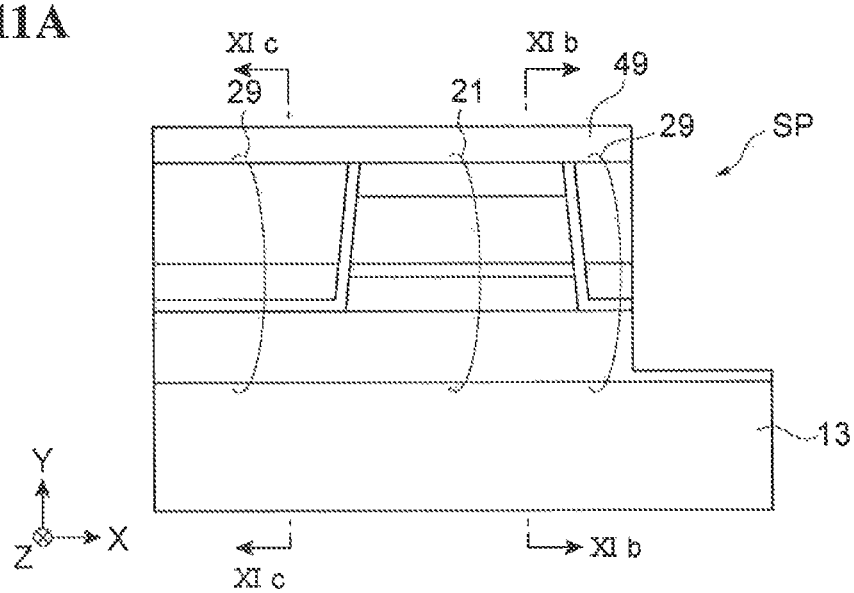
FIGS. 11A to 11C illustrate steps in the method for producing a semiconductor optical device according to this embodiment.
Figure 11B:
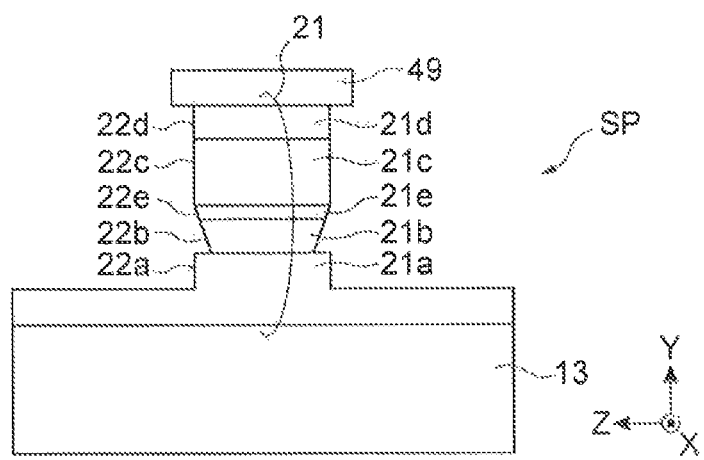
Figure 11C:
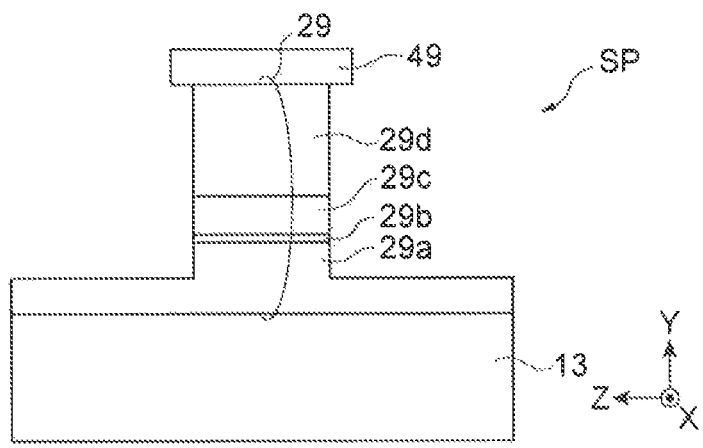

Subsequently, as illustrated in FIG. 11A to FIG. 11C, the substrate product SP is etched while the first mask 49 is left. The side surface of the light-absorbing layer 22b in the mesa structure is etched. The side surface of the light-absorbing layer 22b is recessed with respect to the side surface of the first cladding layer 22a. This etching is performed using a wet etching method. In this wet etching, an etchant such as an aqueous mixed solution of hydrochloric acid, acetic acid, and hydrogen peroxide is used. The side surface of the light-absorbing layer 22b is selectively etched using the etchant while the side surfaces of the first and second cladding layers are not etched. A side surface of the optical waveguide, i.e. a side surface of the mesa structure in the second region, is not etched by the wet etching. The side surface of the graded layer 22e is slightly etched during the wet etching process. By performing the wet etching, inverted mesa-shaped side surfaces are formed both on the graded layer 21e and the light-absorbing layer 21b. The side surface of the light-absorbing layer 22b has an inclined surface toward the inside of the photodiode 15a. The wet etching is continued until the side surface of the light-absorbing layer 22b inclines toward the inside of the photodiode 15a. The etching amount is decided using a width of a recess in which the side surfaces of graded layer and the light-absorbing layer are recessed with respect to the side surfaces of the first and second cladding layers. The width of the recess is suitably in the range of 0.05 μm or more and 0.2 μm or less at the lower end of the light-absorbing layer 21b. FIG. 11B is a sectional view taken along line XIb-XIb of FIG. 11A. FIG. 11C is a sectional view taken along line XIc-XIc of FIG. 11A.

After the wet etching of the mesa structure, the first mask 49 is removed. Subsequently, a second mask 51 is formed on the substrate product SP. For example, the second mask 51 is formed as follows: an insulating layer (e.g., SiN layer) is deposited on the contact layer 21d and the upper cladding layer 29d, and then photolithography and etching are performed on the insulating layer to form a second mask 51 having a desired pattern. In the photodiode 15a, the second mask 51 is disposed on the upper surface of the first semiconductor multilayer 21, but is not disposed on the side surfaces of the first semiconductor multilayer 21. Therefore, the side surfaces of the first semiconductor multilayer 21 are exposed at the opening of the second mask 51. In the optical waveguide 15b, the second mask 51 is disposed on the upper surface of the semiconductor multilayer 29, but is not disposed on the side surfaces of the second semiconductor multilayer 29 at the joint section at which the optical waveguide 15b forms a butt-joint with the photodiode 15a. Therefore, at the joint section of the optical waveguide 15b, the side surfaces of the second semiconductor multilayer 29 are exposed at the opening of the second mask 51. At the light propagating section connected to the joint section of the optical waveguide 15b, the second mask 51 is disposed on the upper surface and on the side surfaces of the second semiconductor multilayer 29.

Figure 12A:
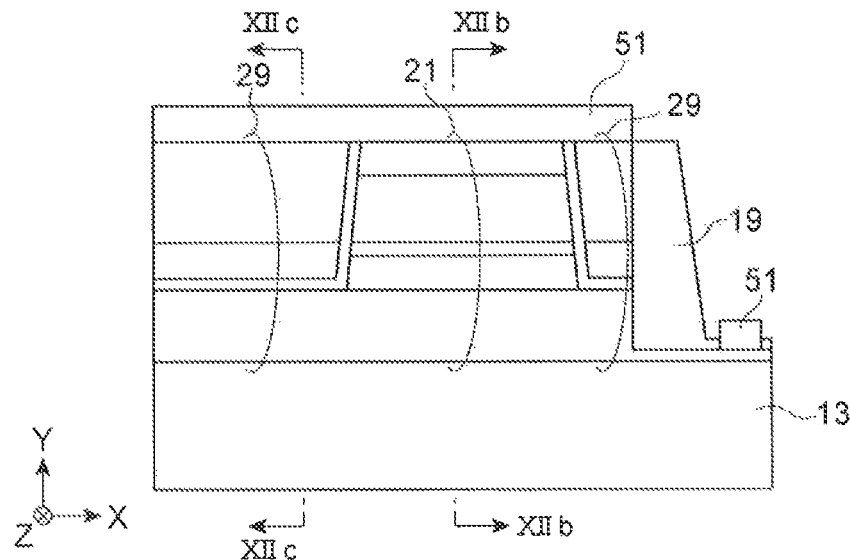
FIGS. 12A to 12C illustrate steps in the method for producing a semiconductor optical device according to this embodiment.
Figure 12B:
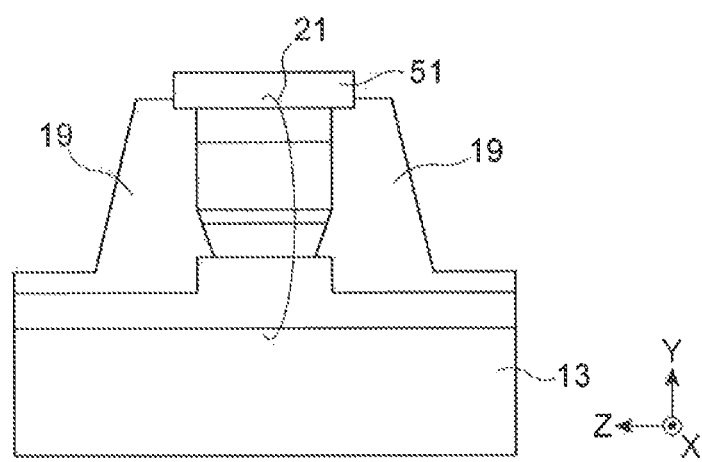
Figure 12C:
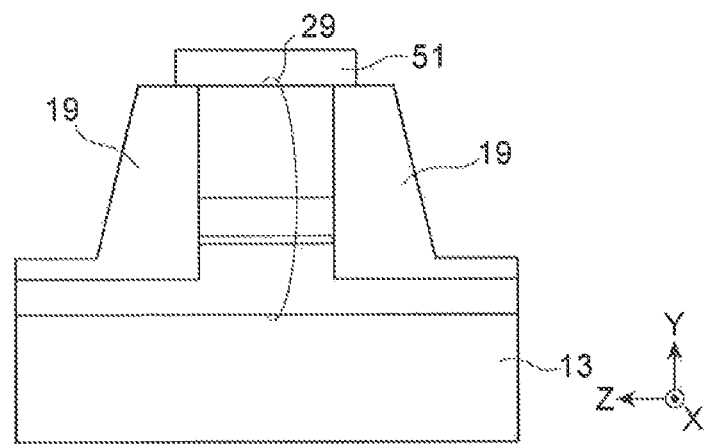

Subsequently, as illustrated in FIG. 12A to FIG. 12C, a buried layer 19 is formed on the substrate product SP using the second mask 51. Specifically, a semi-insulating III-V compound semiconductor doped with a transition metal is grown. Consequently a semi-insulating semiconductor layer 19a is grown on the side surfaces of the first semiconductor multilayer 21, the joint section, and the second semiconductor multilayer 29. The thickness of the semi-insulating semiconductor layer 19a is suitably in the range of 0.4 μm or more and 1.5 μm or less at the upper end of the light-absorbing layer. When necessary, an undoped semiconductor layer 19b may be grown after the growth of the semi-insulating semiconductor layer 19a. The thickness of the undoped semiconductor layer 19b is suitably in the range of 0.05 μm or more and 0.1 μm or less at the upper end of the light-absorbing layer. The undoped semiconductor layer 19b on the semi-insulating semiconductor layer 19a contributes to a decrease in the dark current of the photodiode. FIG. 12B is a sectional view taken along line XIIb-XIIb of FIG. 12A. FIG. 12C is a sectional view taken along line XIIc-XIIc of FIG. 12A.

Figure 13A:
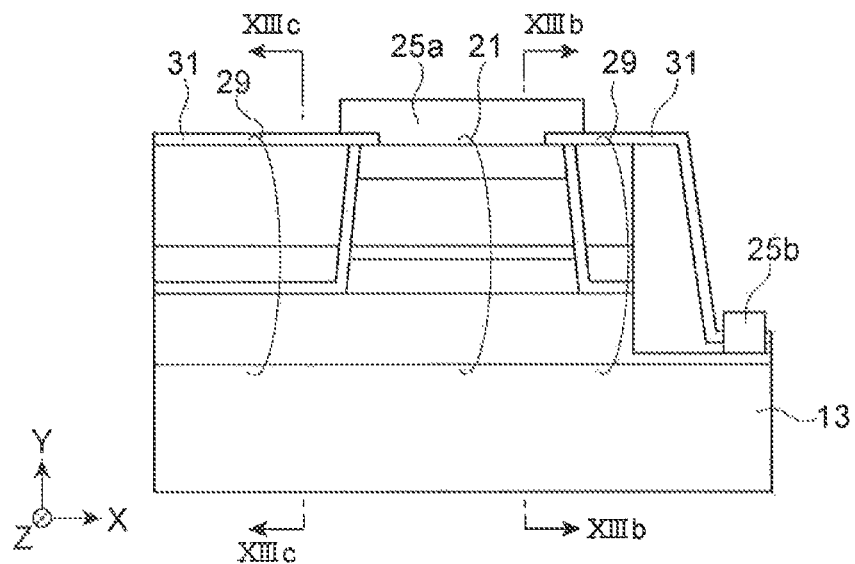
FIGS. 13A to 13C illustrate steps in the method for producing a semiconductor optical device according to this embodiment.
Figure 13B:
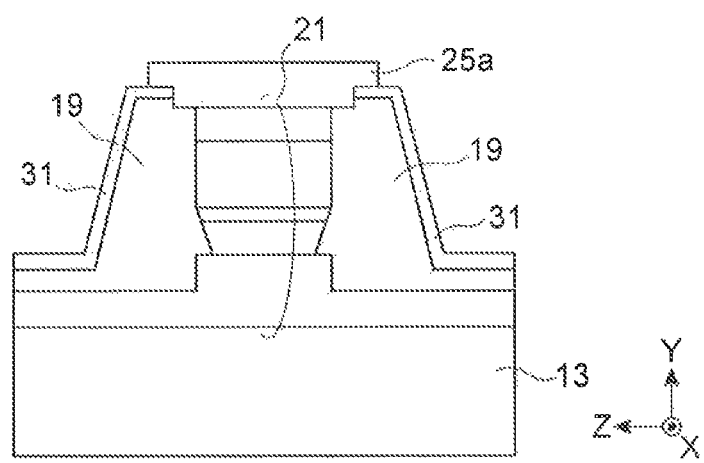
Figure 13C:
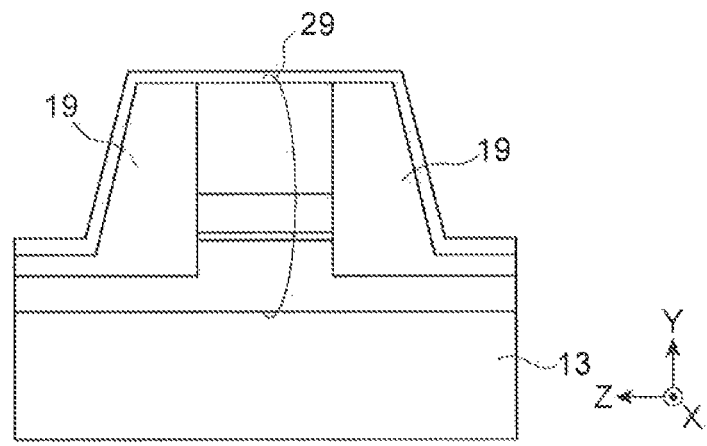

After the forming of the buried layer 19, as illustrated in FIG. 13A to FIG. 13C, a protective layer 31 is deposited on the entire substrate. The protective layer 31 may include an insulating layer (e.g., SiN layer). Openings for forming connection to an anode electrode and a cathode electrode are formed in the protective layer 31. Then, a first electrode 25a that is in contact with the contact layer 21d of the first semiconductor multilayer 21 is formed. A second electrode 25b that is in contact with the first cladding layer 21a of the first semiconductor multilayer 21 is also formed. FIG. 13B is a sectional view taken along line XIIIb-XIIIb of FIG. 13A. FIG. 13C is a sectional view taken along line XIIIc-XIIIc of FIG. 13A.

Through these processes, a semiconductor optical device 11 is produced. In this production method, a mesa structure in which the side surface of the light-absorbing layer 21b is recessed with respect to the side surface 22a of the first cladding layer 21a is formed by performing wet etching of the substrate product SP. The side surface 22b of the light-absorbing layer 21b is recessed with respect to the side surface 22a of the first cladding layer 21a. Therefore, the distribution of an electric field that extends from the first cladding layer 21a through the light-absorbing layer 21b to the second cladding layer 21c is constricted at the light-absorbing layer 21b having the recessed side surface 22b. The constriction of the electric field decreases the capacitance of the photodiode 15a. Furthermore, the buried layer 19 composed of a III-V compound semiconductor doped with a transition metal is grown on the side surfaces of the first semiconductor multilayer 21 and the second semiconductor multilayer 29. The side surfaces 17c of the photodiode 15a are covered with a semi-insulating semiconductor layer 19a doped with a transition metal, which decreases the dark current related to the side surfaces 17c of the photodiode 15a.

Example 2

A first multilayer of semiconductor layers (n-type cladding layer, light-absorbing layer, p-type cladding layer, and p-type contact layer) constituting a photodiode is grown on a semi-insulating InP substrate by an OMVPE method. A butt-joint mask that defines a butt-joint mesa of the photodiode is formed. A portion of the first multilayer which is not covered with the butt-joint mask is removed by wet etching. Herein, the light-absorbing layer, the p-type cladding layer, and the p-type contact layer are removed, but the n-type cladding layer is left without being removed. A second multilayer including semiconductor layers (Fe doped buffer layer, core layer, and upper cladding layer) for an optical waveguide is grown on a portion of the semiconductor surface not covered with the butt-joint mask by an OMVPE method. The butt-joint mask is used as a selective growth mask.

After the growth, the butt-joint mask is removed. A mesa-forming mask that defines the shapes of the optical waveguide and the photodiode is formed. The first and the second semiconductor multilayers are dry-etched using the mesa-forming mask to form a mesa having a height of 2.5 μm. The mesa formed by the dry etching has side surfaces that extend in a direction substantially perpendicular to the substrate surface. Thus, a photodiode mesa and an optical waveguide mesa joined to the photodiode mesa are formed. The optical waveguide mesa includes a first portion joined to the photodiode and a second portion connected to the first portion.

The mesa-forming mask is removed. Then, a burying mask is formed. The burying mask covers the upper surface of the photodiode mesa and the upper surface of the first portion of the optical waveguide mesa. Side surfaces of the photodiode mesa and the side surfaces of the first portion of the optical waveguide are exposed from the burying mask. The burying mask also covers the upper surface and both side surfaces of the optical waveguide mesa in the second portion. The burying mask also covers a semiconductor region in which the optical waveguide mesa and the photodiode mesa are not formed, and covers a semiconductor region on which an n-side electrode is to be disposed.

After the formation of the burying mask, a recess is formed on the side surfaces of the light-absorbing layer in the photodiode mesa by wet-etching using an aqueous mixed solution of hydrochloric acid, acetic acid, and hydrogen peroxide. This etching is controlled as follows. For example, the etching is performed until the width of the recess of one side surface of the mesa at the lower end of the light-absorbing layer reaches 0.15 μm. As a result of this etching, the side surfaces of the light-absorbing layer have an inverted mesa structure.

An Fe doped InP is selectively grown by an OMVPE method using the burying mask. The Fe concentration is, for example, $5 \times 10^{16}$ cm$^{-3}$. The thickness of the Fe doped InP is controlled as follows. For example, the relationship between the growth time of the Fe doped InP and the thickness of the Fe doped InP at the upper end of the light-absorbing layer is investigated using a dummy wafer in advance, and the growth time is controlled so that the thickness of the Fe doped InP at the upper end of the light-absorbing layer is 0.4 μm.

When necessary, an undoped semiconductor layer may be additionally disposed on the surface of the semi-insulating buried layer. In this case, after the selective growth of the Fe doped InP, the OMVPE method is performed so that an InP raw material is continuously supplied while the supply of an Fe raw material is stopped. Thus, selective growth can be performed continuously from the growth of the semi-insulating buried layer.

After the burying mask is removed, isolation etching, formation of an ohmic electrode, and formation of metal interconnection are performed to complete a semiconductor optical device.

In the above preferred embodiments, the principle of the present invention has been described with reference to the drawings, but those skilled in the art recognize that the present invention can be modified in terms of structures and details without departing from such principle. The present invention is not limited to a particular structure disclosed in the above embodiments. Accordingly, a right to make all corrections and modifications based on the claims and the scope of the spirit of the claims is claimed.

What is claimed is:

1. A semiconductor optical device comprising:
   a substrate including a first region and a second region that are arranged in a first direction;
   a photodiode disposed on the first region of the substrate, the photodiode having a first end surface and a second end surface opposite to the first end surface, the first end surface extending along a reference plane intersecting with the first direction;
   an optical waveguide disposed on the second region of the substrate, the optical waveguide being in direct contact with the first end surface of the photodiode at a first butt-joint portion; and
   a buried layer disposed on a side surface of the photodiode that extends in the first direction, the buried layer being composed of a III-V compound semiconductor doped with a transition metal, wherein
   the photodiode includes a stacked semiconductor layer including a first cladding layer disposed on the substrate, a light-absorbing layer disposed on the first cladding layer, and a second cladding layer disposed on the light-absorbing layer,
   the light-absorbing layer has a side surface that inclines from a side surface of the first cladding layer to a side surface of the second cladding layer whereby the side surface of the light-absorbing layer is recessed with respect to the side surface of the first cladding layer,
   the buried layer is in contact with a side surface of the stacked semiconductor layer that includes the side surfaces, of the first cladding layer, the light-absorbing layer and the second cladding layer,
   the optical waveguide includes a waveguide semiconductor multilayer,
   the waveguide semiconductor multilayer is in direct contact with the second end surface of the photodiode at a second butt-joint portion, and
   the buried layer is disposed on a side surface of the waveguide multilayer and on the second butt-joint portion.

2. The semiconductor optical device according to claim 1, wherein
   the stacked semiconductor layer further includes a graded layer whose composition changes in a thickness direction, the graded layer being disposed between the light-absorbing layer and the second cladding layer, and
   the graded layer has a side surface recessed with respect to the side surface of the second cladding layer.

3. The semiconductor optical device according to claim 1, wherein the buried layer has a thickness of 0.4 μm or more and 1.5 μm or less at an upper end of the light-absorbing layer.

4. The semiconductor optical device according to claim 1, further comprising:
   an undoped semiconductor layer disposed on a side surface of the photodiode and on the buried layer.

5. The semiconductor optical device according to claim 1, wherein the side surface of the light-absorbing layer is recessed from the side surface of the first cladding layer in a range from 0.05 μm to 0.2 μm.

6. The semiconductor optical device according to claim 1, wherein
   the wave guide semiconductor multilayer includes a lower cladding layer disposed on the substrate, a semi-insulating layer disposed on the lower cladding layer, a core layer disposed on the semi-insulating layer and an upper cladding layer disposed on the core layer, and
   the lower cladding layer is a same layer as the first cladding layer of the photodiode.

7. The semiconductor optical device according to claim 6, wherein
   the semi-insulating layer is composed of a III-V compound semiconductor doped with a transition metal,
   the semi-insulating layer includes a first portion and a second portion,
   the first semi-insulating layer portion covers the first end surface and the second end surface of the photodiode, and
   the second semi-insulating layer portion is disposed on the second region of the substrate.

8. A method for producing a semiconductor optical device, the method comprising the steps of;
 preparing a substrate including a first region and a second region;
 forming an epitaxial wafer including a first semiconductor multilayer disposed on the first region of the substrate, and a second semiconductor multilayer disposed on the second region of the substrate, the first semiconductor multilayer including a first cladding layer, a light-absorbing layer, and a second cladding layer stacked in that order on the substrate;
 forming a first mask on the epitaxial wafer, the first mask having a first pattern defining a photodiode and a second pattern defining an optical waveguide;
 forming a mesa structure in the first and second regions by etching the first semiconductor multilayer and the second semiconductor multilayer using the first mask;
 forming a recessed side surface of the light-absorbing layer in the mesa structure in the first region by selectively etching the light-absorbing layer using a wet etching method; and
 forming a buried layer composed of a III-V compound semiconductor doped with a transition metal on a side surface of the mesa structure, wherein
 the recessed side surface of the light-absorbing layer inclines from a side surface of the first cladding layer to a side surface of the second cladding layer, and
 the buried layer is in contact with a side surface if the first semiconductor multilayer that includes the side surfaces of the first cladding layer, the light-absorbing layer and the second cladding layer.

9. The method according to claim 8, wherein the recessed side of the light absorbing layer is recessed from the side surface of the first cladding layer by from 0.05 µm to 0.2 µm.

10. The method according to claim 8, further comprising a step of growing an undoped semiconductor layer on the buried layer.

\* \* \* \* \*